United States Patent [19]

Denda

[11] Patent Number: 4,977,339

[45] Date of Patent: Dec. 11, 1990

[54] SEMICONDUCTOR INTEGRATED CIRCUIT HAVING A MOS TRANSISTOR WITH A THRESHOLD LEVEL TO ENABLE A LEVEL CONVERSION

[75] Inventor: Akira Denda, Tokyo, Japan

[73] Assignee: NEC Corporation, Japan

[21] Appl. No.: 303,845

[22] Filed: Jan. 30, 1989

[30] Foreign Application Priority Data

Jan. 30, 1988 [JP] Japan ................... 63-19751

[51] Int. Cl.5 ......................................... H03K 19/094
[52] U.S. Cl. ..................................... 307/475; 307/362; 307/264; 307/448
[58] Field of Search ............... 307/446, 448, 475, 362, 307/264

[56] References Cited

U.S. PATENT DOCUMENTS

| | | | |
|---|---|---|---|
| 4,437,171 | 3/1984 | Hudson et al. ................ | 307/475 X |
| 4,453,095 | 6/1984 | Wrathall ............... | 307/475 |
| 4,563,601 | 1/1986 | Asano et al. ............ | 307/475 |
| 4,591,742 | 5/1986 | Morito ............ | 307/448 X |
| 4,656,372 | 4/1987 | Savi et al. ............ | 307/475 |
| 4,704,549 | 11/1987 | Sanwo et al. ............ | 307/475 |
| 4,719,372 | 1/1988 | Chappell et al. ............. | 307/264 X |
| 4,767,951 | 8/1988 | Cornish et al. ............ | 307/448 X |
| 4,788,459 | 11/1988 | Tsugaru et al. ............ | 307/446 X |

Primary Examiner—David Hudspeth
Attorney, Agent, or Firm—Laff, Whitesel, Conte & Saret

[57] ABSTRACT

A semiconductor integrated circuit comprises a positive voltage line, a negative voltage line, a ground line, a first circuit connected between the ground line and one of the positive voltage line and the negative voltage line so as to be driven by a voltage difference between the ground line and the one of the positive voltage line and the negative voltage line, and a second circuit connected between the ground line and the other of the positive voltage line and the negative voltage line so as to be driven by a voltage difference between the ground line and the other of the positive voltage line and the negative voltage line. A signal level conversion circuit includes a MOS transistor having a gate connected to an output of the first circuit and a drain connected through a resistor to the ground line. A source of the transistor is connected to the other of the positive voltage line and the negative voltage line, and the drain of the transistor is connected to an input of the second circuit. This transistor has its threshold voltage whose absolute value is larger than an absolute value of a voltage difference between the ground line and the other of the positive voltage line and the negative voltage line.

3 Claims, 2 Drawing Sheets

SEMICONDUCTOR INTEGRATED CIRCUIT HAVING A MOS TRANSISTOR WITH A THRESHOLD LEVEL TO ENABLE A LEVEL CONVERSION

BACKGROUND OF THE INVENTION

1. Field of the Invention

The present invention relates to a semiconductor integrated circuit, and more specifically to a signal level conversion circuit for use in a so-called BiMOS semiconductor logic integrated circuit composed of bipolar transistors and MOS transistors which are formed in a mixed manner on the same single chip.

2. Description of related art

BiCMOS semiconductor logic integrated circuits have been composed of CMOS (complementary metal-oxide-semiconductor) transistors and bipolar transistors formed on the same single chip so that the circuits can have both advantages of the CMOS transistors such as a low power dissipation and a high integration density and advantages of the bipolar transistors such as a high operation speed and a high driving power. In fact, the BiCMOS logic circuits have already achieved a gate delay time partially overlapping with that obtained in conventional ECL (emitter coupled logic) logic circuits. Therefore, it has been expected that the ECL logic circuits will be replaced by the BiCMOS circuits in applications or areas where a relatively large gate delay time is permitted.

Considering compatibility with the ECL logic circuits, the BiCMOS logic circuits are required to be driven at the same supply voltage level as that of the existing ECL logic circuits. For example, the BiCMOS logic circuits are required to be capable of operating at a so-called ECL input/output level by introducing a nominal supply voltage of $-4.5$ V into the chip. On the other hand, taking into consideration the compatibility with TTL (transistor-transistor logic) logic circuits, the BiCMOS logic circuits are preferred to be driven at a so-called TTL input/output level by connecting a nominal supply voltage of $+5.0$ V to the chip. Therefore, if the ECL circuits and the TTL circuits are combined on the same signal chip, the chip is connected to both a supply voltage of $-4.5$ V and another supply voltage of $+5.0$ V. In this case, as a result, there is needed a signal level conversion circuit for converting a signal level between a circuit connected between $+5.0$ V and the grounds ($=0$ V) and another circuit connected between $-4.5$ V and the ground. However, the conventional signal level conversion circuit has been of a differential circuit type, which is relatively large in power consumption and also needs a substantial number of circuit elements. Particularly, the conventional signal level conversion circuit of the differential circuit type requires at least a pair of active circuit elements such as a pair of bipolar transistors, and needs a constant current source.

SUMMARY OF THE INVENTION

Accordingly, it is an object of the present invention to provide a signal level conversion circuit for use in BiCMOS circuits, which conversion circuit has overcome the above mentioned defect of the conventional one.

Another object of the present invention is to provide a signal level conversion circuit for use in BiCMOS circuits, which conversion circuit is very simple in construction and can operate at a lower power consumption and is composed of a relatively small number of circuit elements.

Still another object of the present invention is to provide a signal level conversion circuit for use in BiCMOS circuits, which conversion circuit is composed of a single transistor without a constant current source.

The above and other objects of the present invention are achieved in accordance with the present invention by a semiconductor integrated circuit comprising a positive voltage line, a negative voltage line, a ground line, a first circuit connected between the ground line and one of the positive voltage line and the negative voltage line so as to be driven by a voltage difference between the ground line and the one of the positive voltage line and the negative voltage line, a second circuit connected between the ground line so as to be driven by a voltage different between the ground line so as to be driven by a voltage line and the negative voltage line, and a signal level conversion circuit including a MOS transistor having a gate connected to an output of the first circuit and a drain connected through a resistor to the ground line, a source of the transistor being connected to the other of the positive voltage line and the negative voltage line, the drain of the transistor being connected to an input of the second circuit, the transistor having its threshold voltage whose absolute value is larger than an absolute value of a voltage difference between the ground line and the other of the positive voltage line and the negative voltage line, so that a signal which appears at the output of the first circuit and whose potential varies between the ground line and the one of the positive voltage line and the negative voltage line, is converted into a signal whose potential varies between the ground line and the other of the positive voltage line and the negative voltage line.

Preferably, the MOS transistor has its threshold voltage whose absolute value is substantially equal to a sum of the absolute value of the voltage difference between the ground line and the other of the positive voltage line and the negative voltage line, and an absolute value of a threshold voltage of the first circuit.

In one preferred embodiment, the first circuit is composed of an ECL circuit connected between the ground line and the negative voltage line so as to be driven by a voltage difference between the ground line and the negative voltage line, and the second circuit is composed of a TTL circuit connected between the ground line and the positive voltage line so as to be driven by a voltage different between the ground line and the positive voltage line, and wherein the MOS transistor is of a p-channel type whose source is connected to the positive voltage line, the p-channel MOS transistor having its threshold voltage whose absolute value is larger than an absolute value of a voltage difference between the ground line and the positive voltage line, so that an output signal of the ECL circuit whose potential varies between the ground line and the negative voltage line, is converted into a signal whose potential varies between the ground line and the positive voltage line.

In addition, the p-channel MOS transistor has its threshold voltage whose absolute-value is substantially equal to a sum of the absolute value of the voltage difference between the ground line and the positive voltage line, and an absolute value of a threshold voltage of the ECL circuit.

In another preferred embodiment, the first circuit is composed of a TTL circuit connected between the ground line and the positive voltage line so as to be driven by a voltage difference between the ground line and the positive voltage line, and the second circuit is composed of an ECL circuit connected between the ground line and the negative voltage line so as to be driven by a voltage difference between the ground line and the negative voltage line, and wherein the MOS transistor is of a n-channel type whose source is connected to the negative voltage line, the n-channel MOS transistor having its threshold voltage whose absolute value is larger than an absolute value of a voltage difference between the ground line and the negative voltage line, so that an output signal of the TTL circuit whose potential varies between the ground line and the positive voltage line, is converted into a signal whose potential varies between the ground line and the negative voltage line.

Furthermore, the n-channel MOS transistor has its threshold voltage whose absolute value is substantially equal to a sum of the absolute value of the voltage difference between the ground line and the negative voltage line, and an absolute value of a threshold voltage of the TTL circuit.

The above and other objects, features and advantages of the present invention will be apparent from the following description of preferred embodiments of the invention with reference to the accompanying drawings.

DESCRIPTION OF THE PREFERRED EMBODIMENTS

Figure 1:
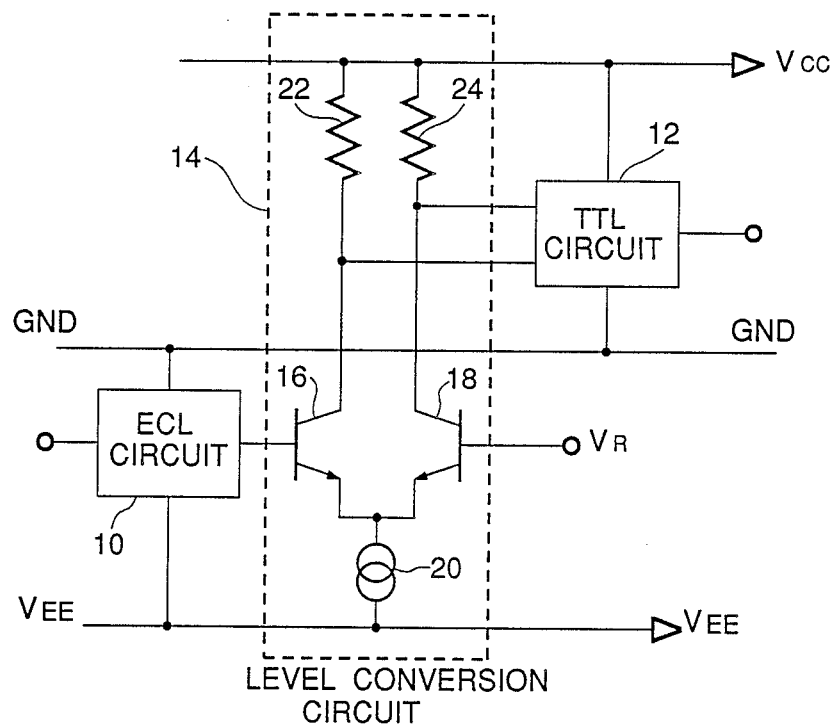
FIG. 1 is a circuit block diagram of a conventional signal level conversion circuit for use in BiCMOS circuits.

Referring to FIG. 1, there is shown a circuit block diagram of a conventional signal level conversion circuit for use in BiCMOS circuits. The shown BiCMOS circuit includes a ECL circuit 10 connected between a negative voltage supply $V_{EE}$ and ground GND, and an TTL circuit 12 connected between a positive voltage supply $V_{cc}$ and the ground GND. A signal level conversion circuit 14 coupled between the ECL circuit 10 and the TTL circuit 12 is composed of a differential circuit, which includes a first bipolar transistor 16 connected at its base to an output of the ECL circuit 10 and a second bipolar transistor 18 connected at its base to receive a reference voltage $V_R$. Respective emitters of these transistors 16 and 18 are commonly connected to each other and also connected through a constant current source 20 to the negative voltage supply $V_{EE}$. Further, collectors of the transistors 16 and 18 are connected through resistors 22 and 24 to the positive voltage supply $V_{CC}$, respectively. A connection node between the collector of each transistor and the corresponding resistor is connected to a corresponding one of a pair of inputs of the TTL circuit 12.

With the above mentioned arrangement, by giving the reference voltage $V_R$ which is the same as a threshold voltage of the ECL circuit 10, the output signal of the ECL circuit 10 varying between the ground level GND and the negative voltage $V_{EE}$ is converted to a signal varying between the positive voltage $V_{CC}$ and the ground level GND.

In the signal level conversion circuit 14, however, an electric current of a few milliamperes continues to flow in the differential circuit connected between the positive voltage supply $V_{CC}$ and the negative voltage supply $V_{EE}$. In other words, if the positive voltage supply $V_{CC}$ is +5.0 V and the negative voltage supply $V_{EE}$ is −4.5 V, the electric current of a few milliamperes is ceaselessly flowed across a potential difference of about 10 V. This is a substantial electric power consumption in the conventional signal level conversion circuit shown in FIG. 1. In addition, the differential circuit has needed a pair of transistors 16 and 18, and one load resistor (22 or 24) has been required for each of the pair of transistors. Furthermore, the constant current source 20 has been associated to the differential circuit. Therefore, the signal level conversion circuit 14 has needed a substantial number of circuit elements, which would accordingly occupy a substantial chip area.

Figure 2:
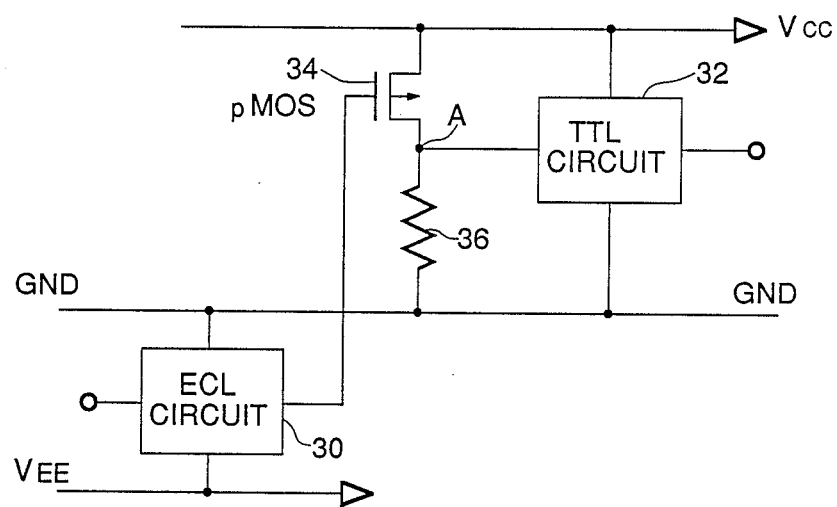
FIG. 2 is a circuit block diagram of one embodiment of the signal level conversion circuit in accordance with the present invention for use in BiCMOS circuits.

Referring to FIG. 2, there is shown a circuit block diagram of one embodiment of the signal level conversion circuit in accordance with the present invention for use in BiCMOS circuits. The shown BiCMOS circuit includes an ECL circuit 30 connected between a negative voltage supply $V_{EE}$ and ground GND, and a TTL circuit 32 connected between a positive voltage supply $V_{CC}$ and the ground GND. For a signal level conversion between the ECL circuit 30 and the TTL circuit 32, a p-channel MOS transistor 34 is connected at its gate to an output of the ECL circuit 30 and at its source to the positive voltage supply $V_{CC}$. A drain of the transistor 34 is connected through a resistor 36 to the ground GND and a connection node "A" between the drain of the transistor 34 and the resistor 36 is connected to an input of the TTL circuit 32. Thus, the transistor 34 and the resistor 36 constitutes a signal level conversion circuit.

In the above mentioned circuit, the p-channel MOS transistor 34 is designed to have a threshold voltage $V_{TP}$ whose absolute value $|V_{TP}|$ is substantially equal to a sum of an absolute value $|V_{CC}|$ of the positive voltage $V_{CC}$ and an absolute value of a threshold voltage $|V_{T\text{-}ECL}|$ of the ECL circuit 30 (or a threshold voltage $|V_{T\text{-}BIC}|$ of a BiCMOS circuit having an logic output varying between the ground GND and the negative voltage supply $V_{EE}$ in the case that the BiCMOS circuit is connected between the ground GND and the negative voltage supply $V_{EE}$ in place of the ECL circuit 30). Namely, $$|V_{TP}| \approx |V_{CC}| + |V_{T\text{-}ECL}|$$

For example, if $V_{CC}=5$ V and $V_{T\text{-}ECL}=-1.3$ V, $V_{TP}=-6.3$ V. Further, if $V_{CC}=5$ V and $V_{T\text{-}BIC}=-2.6$ V, $V_{TP}=-7.6$ V.

Now, if the ECL circuit 30 outputs a signal of a low level "L", the p-channel MOS transistor 34 is brought into an ON condition. Therefore, the node "A" is elevated to a level near to the positive voltage $V_{CC}$, and accordingly, a signal of a high level "H" is inputted to the TTL circuit 32.

On the other hand, if the ECL circuit 30 outputs a signal of a high level "H", the p-channel MOS transistor 34 is brought into an OFF condition. As a result, the node "A" is pulled down to a level near to the voltage of the ground GND, and accordingly, a signal of a low level "L" is inputted to the TTL circuit 32.

As seen from the above, only electric power consumed in the signal level conversion circuit shown in FIG. 2 is due to a current flowing through the p-channel MOS transistor 34 only when it is in the ON condition. Namely, there is no ceaselessly flowing current in the signal level conversion circuit shown in FIG. 2. In this point, the signal level conversion circuit shown in FIG. 2. In this point, the signal level conversion circuit shown in FIG. 2 is a low power consumption as compared with the that in the conventional circuit shown in FIG. 1. In addition, the ON current of the p-channel MOS transistor 34 is in the order of a few hundred microamperes. Accordingly, the power consumption of the signal level conversion circuit is greatly decreased as compared with that in the conventional circuit shown in FIG. 1.

Figure 3:
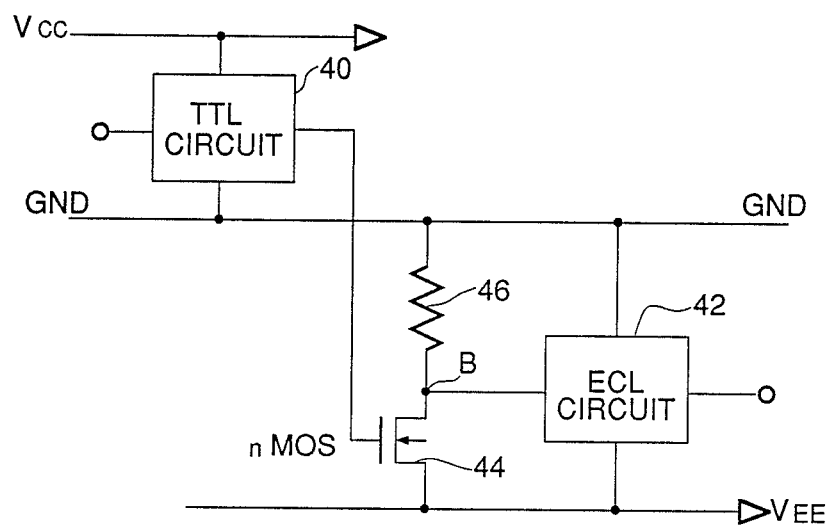
FIG. 3 is a diagram similar to FIG. 2 but showing another embodiment of the signal level conversion circuit in accordance with the present invention for use in BiCMOS circuits.

Turning to FIG. 3, there is shown a circuit block diagram of another embodiment of the signal level conversion circuit in accordance with the present invention for use in BiCMOS circuits. The shown BiCMOS circuit includes a TTL circuit 40 connected between a positive voltage supply $V_{CC}$ and ground GND and an ECL circuit 42 connected between a negative voltage supply $V_{EE}$ and the ground GND. For a signal level conversion between the TTL circuit 40 and the ECL circuit 42, a n-channel MOS transistor 44 is connected at its gate to an output of the TTL circuit 30 and at its source to the negative voltage supply $V_{EE}$. A drain of the transistor 44 is connected through a resistor 46 to the ground GND and a connection node "B" between the drain of the transistor 44 and the resistor 46 is connected to an input of the ECL circuit 42. Thus, the transistor 44 and the resistor 46 constitutes a signal level conversion circuit.

In the above mentioned circuit, the n-channel MOS transistor 44 is designed to have a threshold voltage $V_{TN}$ whose absolute value $|V_{TN}|$ is substantially equal to a sum of an absolute value $|V_{EE}|$ of the negative voltage $V_{EE}$ and an absolute value of a threshold voltage $|V_{T\cdot TTL}|$ of the TTL circuit 40 (or a threshold voltage $|V_{T\cdot BIC}|$ of a BiCMOS circuit having an logic output varying between the ground GND and the positive voltage supply $V_{CC}$ in the case that the BiCMOS circuit is connected between the ground GND and the positive voltage supply $V_{CC}$ in place of the TTL circuit 40). Namely, $$|V_{TN}| \approx |V_{EE}| + |V_{T\cdot TTL}|$$

For example, if $V_{EE} = -5.2$ V and $V_{T\cdot TTL} = 1.4$ V, $V_{TN} = 6.6$ V. Further, if $V_{EE} = -5.2$ V and $V_{T\cdot BIC} = 2.5$ V, $V_{TP} = 7.7$ V.

Now, if the TTL circuit 40 outputs a signal of a high level "H", the n-channel MOS transistor 44 is brought into an ON condition. Accordingly, the node "B" is pulled down to a level near to the negative voltage $V_{EE}$, and accordingly, a signal of a low level "L" is inputted to the ECL circuit 42.

On the other hand, if the TTL circuit 40 outputs a signal of a low level "L", the n-channel MOS transistor 44 is brought into an OFF condition. Therefore, the node "B" is elevated to a level near to the voltage of the ground GND, and accordingly, a signal of a high level "H" is inputted to the ECL circuit 42.

As seen from the above, only electric power consumed in the signal level conversion circuit shown in FIG. 3 is due to a current flowing through the n-channel MOS transistor 44 only when it is in the ON condition, similarly to the circuit shown in FIG. 2. In addition, the current of the n-channel MOS transistor 44 is in the order of a few hundred microamperes. Therefore, the power consumption of the signal level conversion circuit shown in FIG. 3 is greatly decreased as compared with that int he conventional circuit shown in FIG. 1.

As seen from the above explanation, the signal level conversion circuit in accordance with the present invention can effectively convert a signal level without substantial power consumption, and therefore, can be used or formed in a BiCMOS semiconductor integrated circuit of a low power consumption. Furthermore, the signal level conversion circuit in accordance with the present invention is very simple in construction and is composed of a very small number of circuit elements, and accordingly, can be assembled or formed in a small chip area. This feature is very advantageous to increase of the integration density of the integrated circuit.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated circuit comprising a positive voltage line, a negative voltage line, a ground line, a first circuit connected between said ground line and one of said positive voltage line and said negative voltage line so as to be driven by a voltage difference between said ground line and said one of said positive voltage line and said negative voltage line, a second circuit connected between said ground line and the other of said ground line and the other of said positive voltage line and said negative voltage line so as to be driven by a voltage difference between said ground line and said other of said positive voltage line and said negative voltage line, and a signal level conversion circuit including a MOS transistor having a gate connected to an output of the first circuit and a drain connected through a resistor to said ground line, a source of said transistor being connected to said other of said positive voltage line and said negative voltage line, said drain of said transistor being connected to an input of said second circuit, said transistor having a threshold voltage with an absolute value is larger than an absolute value of a voltage difference between said ground line and the other of said positive voltage line and said negative voltage line, so that a signal which appears as said output of said first circuit having a potential which varies between said ground line and said one of said positive voltage line and said negative voltage line is converted into a signal potential which varies between said ground line and said other of said positive line and said negative voltage line, said transistor having as its threshold voltage an absolute value which is substantially equal to a sum of said absolute value of said voltage difference between said ground line and the other of said positive voltage line and said negative voltage line, and an absolute value of a threshold voltage of said first circuit.

2. A semiconductor integrated circuit comprising a positive voltage line, a negative voltage line, a ground line, a first circuit connected between said ground line and one of said positive voltage line and said negative voltage line so as to be driven by a voltage difference between said ground line and said one of said positive voltage line and said negative voltage line, said first circuit being composed of an ECL circuit connected between said ground line and said negative voltage line so as to be driven by a voltage difference between said ground line and said negative voltage line, a second circuit connected between said ground line and the other of said ground line and the other of said positive voltage line and said negative voltage line so as to be driven by a voltage difference between said ground line and said other of said positive voltage line and said negative voltage line, said second circuit being composed of a TTL circuit connected between said ground line and said positive voltage line so as to be driven by a voltage difference between said ground line and said positive voltage line, and a signal level conversion circuit including a MOS transistor having a gate connected to an output of the first circuit and a drain connected through a resistor to said ground line, a source of said transistor being connected to said other of said positive voltage line and said negative voltage line, said drain of said transistor being connected to an input of said second circuit, said transistor having its threshold voltage with an absolute value which is larger than an absolute value of a voltage difference between said ground line and the other of said positive voltage line and said negative voltage line, so that a signal which appears as said output of said first circuit and having a potential which varies between said ground line and said one of said positive voltage line and said negative voltage line is converted into a signal having a potential which varies between said ground line and said other of said positive line and said negative voltage line, wherein said MOS transistor is of a p-channel type having a source which is connected to said positive voltage line, so that an output signal of said ECL circuit has a potential which varies between said group line and said negative voltage line and is converted into a signal whose potential varies between said ground line and said positive voltage line, and said transistor having a threshold voltage with an absolute value which is substantially equal to a sum of said absolute value of said voltage difference between said ground line and said positive voltage line, and an absolute value of a threshold voltage of said ECL circuit.

3. A semiconductor integrated circuit comprising a positive voltage line, a negative voltage line, a ground line, a first circuit connected between said ground line and one of said positive voltage line and said negative voltage line so as to be driven by a voltage difference between said ground line and said one of said positive voltage line and said negative voltage line so as to be driven by a voltage difference between said ground line and said other of said positive voltage line and said negative voltage line, and a signal level conversion circuit including a MOS transistor having a gate connected to an output of the first circuit and a drain connected through a resistor to said ground line, a source of said transistor being connected to said other of said positive voltage line and said negative voltage line, said drain of said transistor being connected to an input of said second circuit, said transistor having its threshold voltage with an absolute value which is larger than an absolute value of a voltage difference between said ground line and the other of said positive voltage line and said negative voltage line so that a signal which appears as said output of said first circuit and which has a potential that varies between said ground line and said one of said positive voltage line and said negative voltage line is converted into a signal having a potential which varies between said ground line and said other of said positive line and said negative voltage line, said first circuit being composed of a TTL circuit connected between said ground line and said positive voltage line so as to be driven by a voltage difference between said ground line and said positive voltage line, and said second circuit being composed of an ECL circuit connected between said ground line and said negative voltage line so as to be driven by a voltage difference between said ground line and said negative voltage line, and wherein said MOS transistor is of a n-channel type having a source which is connected to said negative voltage line, said n-channel MOS transistor having a threshold voltage with an absolute value which is larger than an absolute value of a voltage difference between said ground line and said negative voltage line, so that an output signal of said TTL circuit having a potential which varies between said ground line and said positive voltage line is converted into a signal having a potential which varies between said ground line and said negative voltage line, said transistor having a threshold voltage with an absolute value which is substantially equal to a sum of said absolute value of said voltage difference between said ground line and said negative voltage line, and an absolute value of a threshold voltage of said TTL circuit.

* * * * *